United States Patent
Chatterjee et al.

(10) Patent No.: US 7,362,621 B2
(45) Date of Patent: Apr. 22, 2008

(54) REGISTER FILE WITH A SELECTABLE KEEPER CIRCUIT

(75) Inventors: Bhaskar P. Chatterjee, Waterloo (CA); Steven K. Hsu, Lake Oswego, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 996 days.

(21) Appl. No.: 10/676,276

(22) Filed: Sep. 30, 2003

(65) Prior Publication Data

US 2005/0068814 A1 Mar. 31, 2005

(51) Int. Cl.
*G11C 7/10* (2006.01)

(52) U.S. Cl. .................... 365/189.06; 365/189.02; 365/203

(58) Field of Classification Search ........... 365/185.13, 365/185.25, 189.11, 203, 204, 189.02, 189.06
See application file for complete search history.

(56) References Cited

U.S. PATENT DOCUMENTS

| 6,204,696 | B1 | 3/2001 | Krishnamurthy et al. |
| 6,510,077 | B1 | 1/2003 | Alvandpour et al. |
| 6,510,092 | B1 | 1/2003 | Mathew et al. |
| 6,512,712 | B1* | 1/2003 | Desai et al. ............... 365/203 |
| 6,549,040 | B1 | 4/2003 | Alvandpour et al. |
| 6,597,623 | B2 | 7/2003 | Krishnamurthy et al. |
| 6,614,680 | B2 | 9/2003 | Alvandpour et al. |
| 6,618,316 | B2 | 9/2003 | Hsu et al. |
| 6,628,143 | B2 | 9/2003 | Hsu et al. |
| 6,628,557 | B2 | 9/2003 | Hsu et al. |
| 6,629,194 | B2* | 9/2003 | Kumar et al. ............... 711/104 |
| 6,674,671 | B1* | 1/2004 | Campbell et al. ....... 365/189.05 |
| 6,690,604 | B2* | 2/2004 | Hsu et al. ............. 365/189.05 |
| 7,002,855 | B2* | 2/2006 | Wijeratne et al. ...... 365/189.12 |
| 7,016,239 | B2* | 3/2006 | Chatterjee et al. ..... 365/189.12 |
| 7,034,576 | B2* | 4/2006 | Levy et al. .................... 326/98 |

\* cited by examiner

*Primary Examiner*—Richard T. Elms
*Assistant Examiner*—Alexander Sofocleous
(74) *Attorney, Agent, or Firm*—Schwabe, Williamson & Wyatt, P.C.

(57) ABSTRACT

A register file includes a multi-level multiplexer output circuit coupled to a global bit trace and keeper circuitry coupled to said global bit trace and a driving signal trace. The register file also has decoder circuitry coupled to said keeper circuitry to selectively decouple the driving signal trace from said global bit trace.

23 Claims, 6 Drawing Sheets

FIG. 1 – Prior Art

| S | LBL | F | Comments |
|---|-----|---|----------|
| 0 | 0   | 0 | Keeper ON |
| 0 | 1   | 0 | Keeper ON |
| 1 | 0   | 1 | Keeper OFF |
| 1 | 1   | 0 | Keeper ON |

310

REGISTER FILE WITH A SELECTABLE KEEPER CIRCUIT

BACKGROUND OF THE INVENTION

1. Field of the Invention

This disclosure relates to memory, and, more particularly, to register file design.

2. Description of the Related Art

In today's computer systems, there are various levels of storage devices. These various levels of storage support different needs. For example, one need in some computer systems is the need for mass storage that are relatively low priced. This need is frequently met by large, inexpensive fixed-disk storage devices. The tradeoff for these large, inexpensive fixed-disk storage devices is that these devices have slow access times.

In comparison, there is, at times in certain systems, a need for memory devices that can provide very quick access for the reading and/or writing of data. A type of such memory devices is referred to as register files, which are often on the same die as a processing unit that accesses them, as they are accessed very frequently. In addition to quick access times, preferably, these devices are robust, and consume low power.

FIG. 1 illustrates a read portion of a prior art dynamic register file design. In this example, eight data cells 140 are multiplexed to support a dynamic local bit line 110. A clock signal 122 is used to precharge the dynamic local bit line 110 to a known value through transistor 124. Keeper circuit 130 is utilized to "keep" the precharged value on the dynamic local bit line 110 during an evaluation phase of a register file access. During the evaluation phase, for a set of eight data cells 140 possibly containing a data value to be "read", one of the read enable lines 142 may be used to enable the read of a corresponding data value 141. Upon the assertion of a read enable line 142, a corresponding stored data value may be driven on the local bit line 110. If no read enable line 142 is enabled for the set of eight data cells 140, the keeper circuit 130 is utilized to retain the precharged value on the local bit line 110. The local bit lines are then utilized to drive a subsequent multiplexing circuit to form a global bit line (not shown).

Applicants have recognized a number of conflicting requirements for efficient and/or effective implementations of such dynamic designs, especially in a new generation of high operating frequency integrated circuits. For example, in order to minimize the evaluation time and thus increase the operating frequency, it is desirable to use low threshold voltage transistors for transistors 144 and 148. However, leakage of current through transistors 144 and 148 will affect the robustness of this prior art design. Since lower threshold voltage transistors are more susceptible to leakage, they can not be employed without addressing their susceptibility. Leakage is undesirable as it may cause erroneous evaluations if too much charge is lost. In contrast, using high threshold voltage transistors results in an unacceptably long read delay as the increased threshold voltages increase response times.

Keeper circuits have been used to increase the robustness of the dynamic local bit line design. Keeper circuits are utilized to maintain the precharged value on the dynamic local bit line 110 in cases where low threshold voltage transistors 144 148 may otherwise allow the improper discharge of the precharged value via leakage current. In order to maintain the prechared value on the local bit line, an upsized transistor 132 is utilized as part of the keeper circuitry 130. However, this upsized keeper also results in a read delay that may be unacceptable for the next generation's high operating frequencies.

Thus, a register file design that is robust, while still being able to operate at high operating frequencies is desired.

BRIEF DESCRIPTION OF THE DRAWINGS

Embodiments of the present invention will be described referencing the accompanying drawings in which like references denote similar elements, and in which.

DETAILED DESCRIPTION OF THE EMBODIMENTS

In the following description, various aspects of the embodiments of the invention will be described. However, it will be apparent to those skilled in the art that other embodiments may be practiced with only some or all of these aspects. For purposes of explanation, specific numbers, materials and configurations are set forth in order to provide a thorough understanding of these embodiments. However, it will also be apparent to one skilled in the art that other embodiments may be practiced without the specific details. In other instances, well-known features are omitted or simplified in order not to obscure the description.

Keeper refers to a circuit added to a dynamic node to maintain that node at a predetermined voltage level. Typically, a keeper is added to a node that, in operation, will periodically be precharged high. The keeper supplies the charge necessary to compensate for the loss of charge due to various leakage paths, as well as loss of charge due to capacitive coupling of the node to other signal paths. A half-keeper is a circuit providing a switchable, direct, conductive pathway between the dynamic node and one voltage source, e.g., a positive voltage source, and therefore operable only to maintain the dynamic node at one level, e.g., a high level. A full-keeper is a circuit providing a switchable, direct, conductive pathway between the dynamic node and two voltage sources, e.g., a positive voltage and ground, and therefore operable to maintain the dynamic node at either a high or low level. A keeper-interrupt is a circuit providing a switchable, direct, conductive pathway between the dynamic node and a first voltage source, e.g., a positive voltage, and a switchable, indirect pathway between the dynamic node and a second voltage source, e.g., ground. In a keeper-interrupt circuit, there is at least one switchable circuit element coupled between the dynamic node and keeper-interrupt pathway to the second voltage source.

The terms metal line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting, electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal salicides are examples of other conductors.

Figure 1:
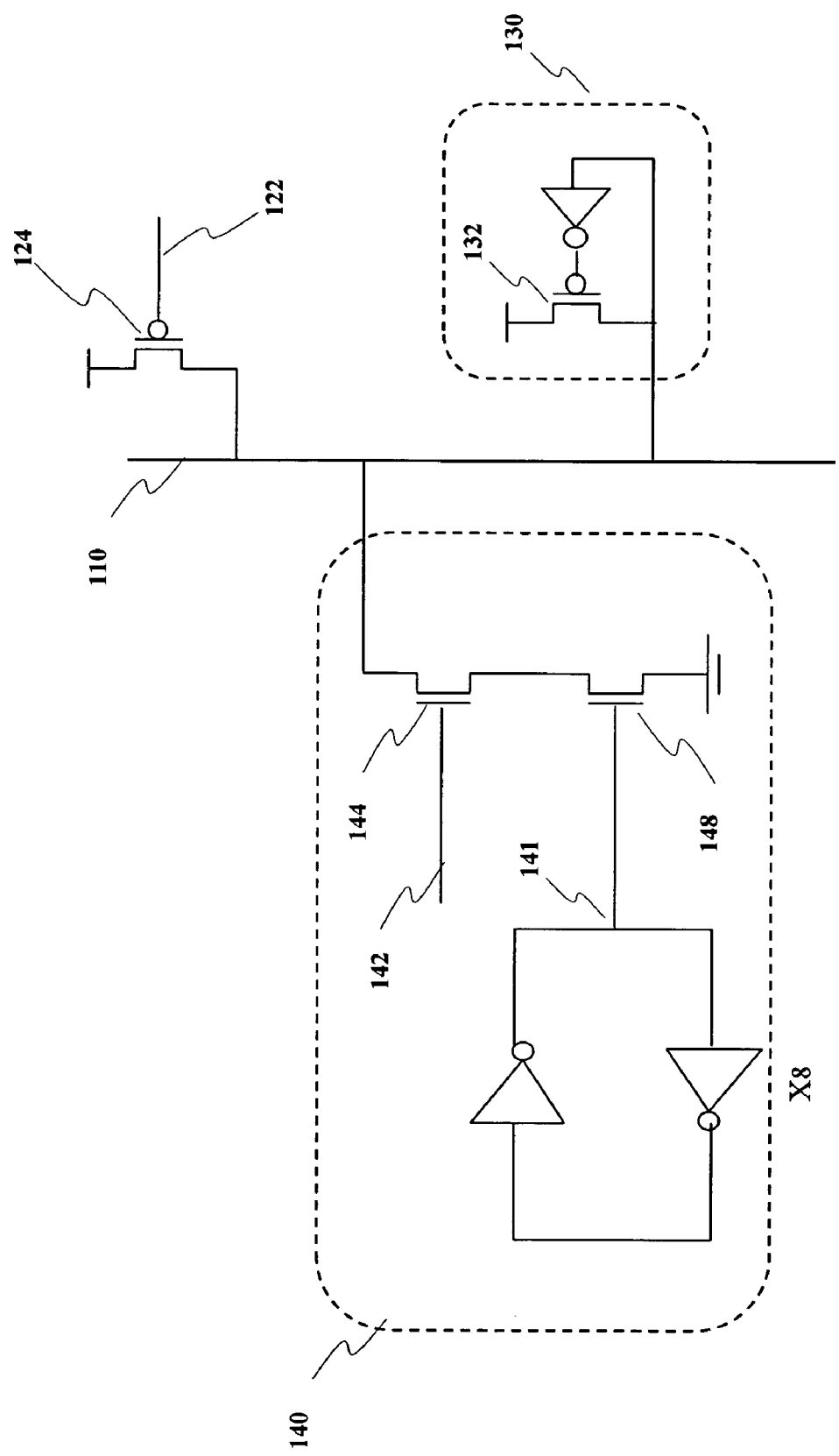
FIG. 1 (Prior Art) illustrates a read portion of a dynamic register file design.
Figure 2:
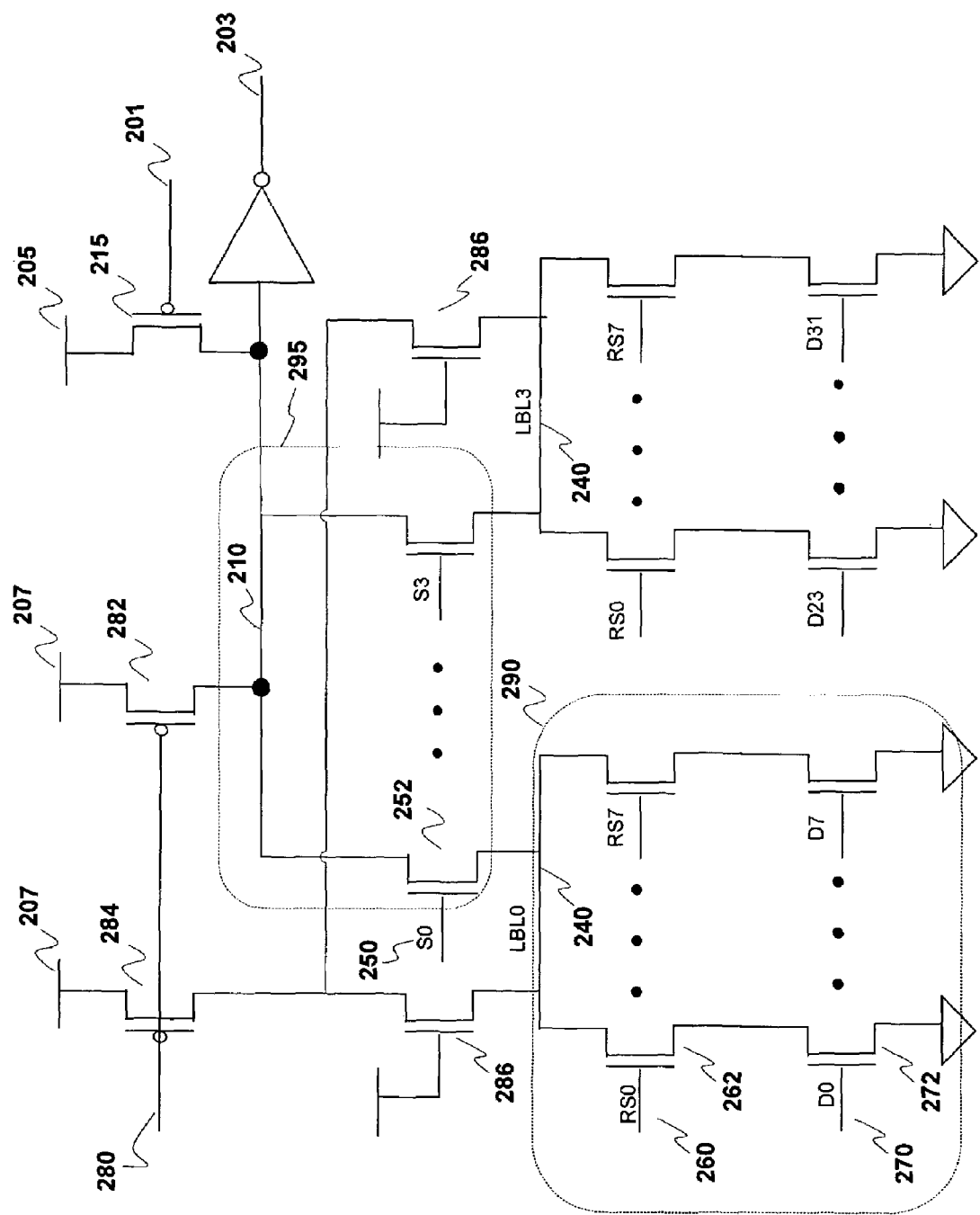
FIG. 2 illustrates a dynamic register file organization with two level multiplexing, in accordance with one embodiment.

FIG. 2 illustrates a dynamic register file organization including 3-stack dynamic gate with two level multiplexing, in accordance with one embodiment. The first level of multiplexing 290 comprises a number of two stack eight-way local bit lines 240. The second level multiplexing 295 corresponds to a "higher-level" global bit line 210.

In the embodiment illustrated, during the precharge portion of a clock cycle, clock signal 280 is utilized to facilitate precharging global bit line 210 to supply voltage, Vcc 207, through transistor 282. In addition, local bit lines 240 are precharged to supply voltage, Vcc 207, utilizing clock signal 280 driving transistor 284 to a voltage level lower than the supply voltage Vcc by value equal to the threshold voltage, Vth, of transistors 286.

Global bit line 210 is coupled to supply voltage 205 through keeper device 215. Keeper device is intended to "keep" the precharge value on the global bit during the evaluation phase if the global bit line does not evaluate to a different value than the precharge value. However, when keeper device 215 comprises a weak P-type MOS device, it may be unable to prevent global bit line 210 from undesirably discharging through the three stack dynamic gates. This undesirable discharge occurs when there was no evaluation of the local bit line stage 290 designed to result in the local bit line changing to a different value. For example, assume a logic "1" on the D0 270 line and an enabled selected line 250 on select transistor 252 as this select line may be shared with other second level global bit line stages. Further assume that, due to coupling on read select lines 260 which drive read select transistors 262, the voltage level on read select signal trace 260 rises above the transistor's threshold voltage. Under these conditions, current may discharge to ground through the three stack pulldown 252 262 272. There may be a particular susceptibility to this if low threshold voltages transistors are used for the three stack pulldown 252 262 272.

One solution is to utilize an upsized PMOS transistor on keeper 215. However, usage of an upsized PMOS device as a keeper 215 may prevent the global bit line 210 from being able to properly evaluate. That is, during the evaluation phase for the register file bit lines, an upsized keeper may prevent the timely discharge of current to ground when a data line has been selected. For example, in the embodiment illustrated in FIG. 2, if read select, RS0 260, and second level select, S0 250, are both enabled and D0 270 is a logic "1", then the global bit line 210 is designed to discharge to lower potential, thus providing the proper value on output signal trace 203. However, if an upsized keeper is utilized, there may not be sufficient time to fully discharge the global bit line 210 to the proper lower potential.

In the embodiment illustrated, the supply voltage 205 is intelligently decoupled from global bit line 210. Referring again to the prior art implementation, recall that the value on the bit line itself is utilized to "keep" the value on the bit line (e.g. by controlling the keeper via gate voltage) utilizing feedback through the keeper device. In the embodiment illustrated, instead of using the feedback value to couple the supply voltage to the bit line via gate control signal 201, the coupling is intelligently controlled. Thus, the global bit line 210 may be decoupled from the supply voltage 205 upon determination that one of the local bit lines 240 will evaluate. This may be performed, for example, by having a decoder selected keeper function control keeper device 215 via gate 201. In this manner, an upsized PMOS device may be utilized for keeper device 215 while still enabling the global bit line 210 to timely evaluate.

Figures 3, 4A:
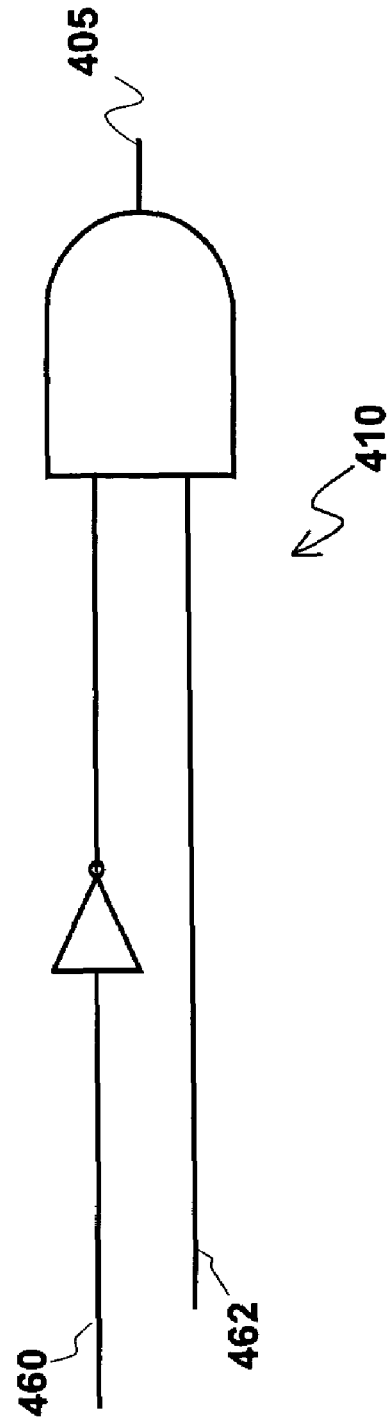
FIG. 3 illustrates a truth table for a decoder selected keeper function, in accordance with one embodiment.
FIGS. 4A and 4B illustrate a gate level implementation of a decoder selected keeper function, in accordance with one embodiment.

FIG. 3 illustrates a truth table for a decoder selected keeper function, in accordance with one embodiment. Shown is the function for the decoupling of the global bit line based on the evaluation of one of the local bit lines. The keeper function, F 310, is asserted, indicating that the decoupling should occur, as a result of the local bit line being selected (S=1) and the local bit line having evaluated (LBL=0). An overall function for the intelligent decoupling of the global bit line may be obtained utilizing the keeper functions, F 310, for each of the local bit lines. Since the decoupling of the global bit line occurs when any of the local bit lines evaluate, the intelligent decoding may be the logical OR of each local bit line's function.

Figure 4B:
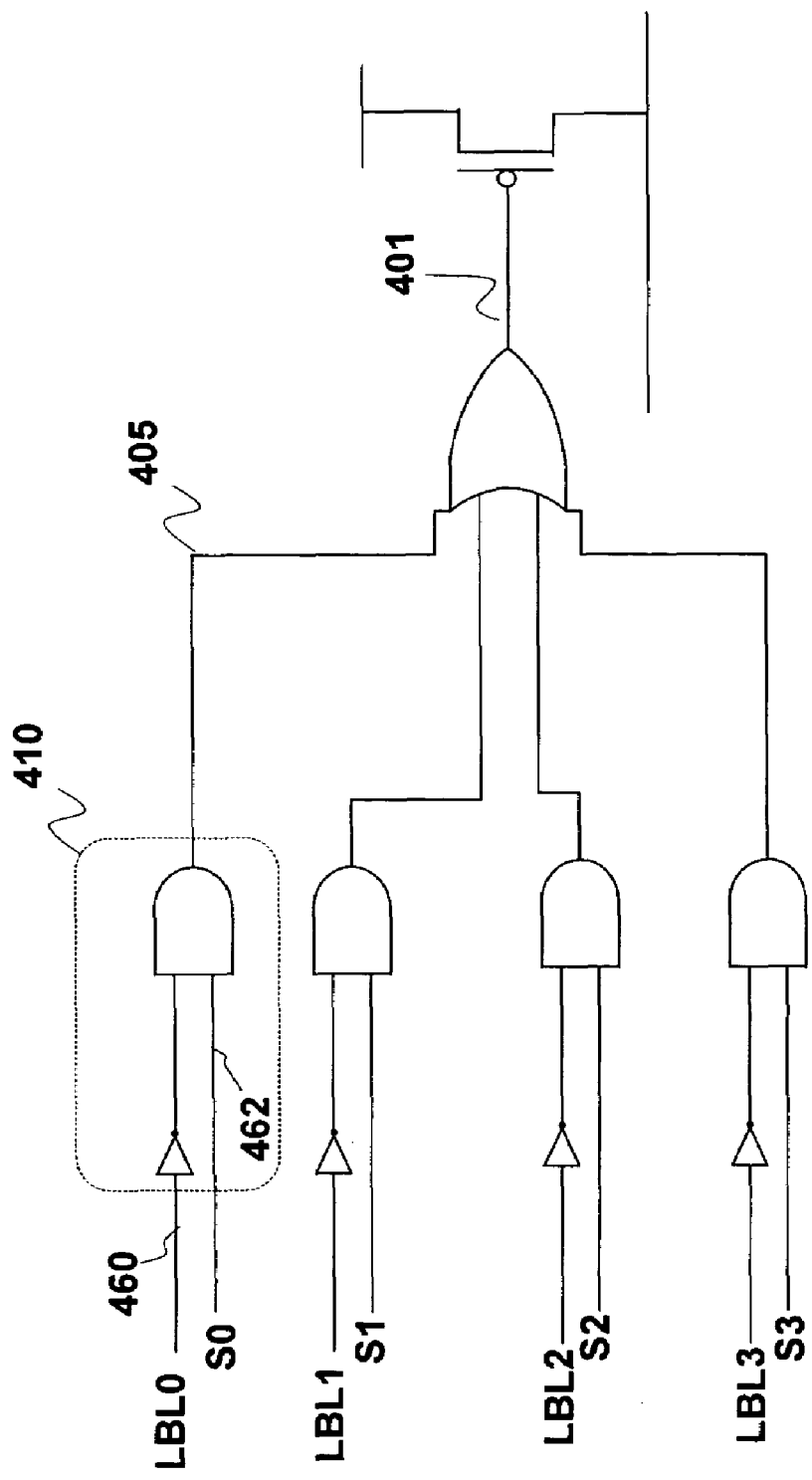

FIGS. 4A and 4B illustrate a gate level implementation of a decoder selected keeper function, in accordance with one embodiment. As illustrated in FIG. 4A, a local bit line decoupling signal 405 may be generated corresponding to each local bit line. Each local bit line signal 460 and corresponding select signal 462 are utilized by local bit line decouple circuit 410 to generate a local bit line decoupling signal 405. As illustrated in FIG. 4B, the local bit line decoupling signals 405 are then ORed to obtain a keeper select signal 401. In this manner, the keeper turns off when the global bit line evaluates. Moreover, the decoder circuit advantageously computes the condition in parallel to the evaluation of the global bit line.

Figure 5:
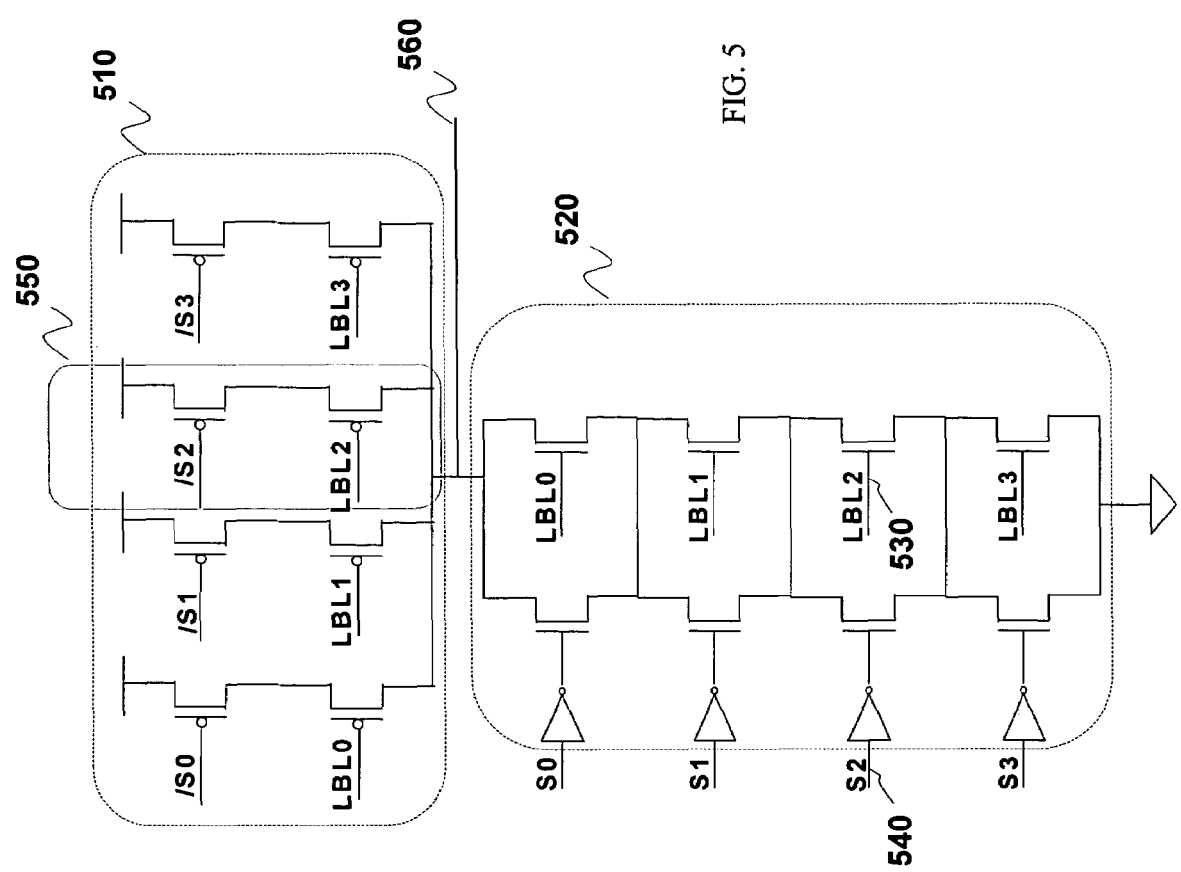
FIG. 5 illustrates a transistor level implementation of a decoder selected keeper function, in accordance with one embodiment.

FIG. 5 illustrates a transistor level implementation of a decoder selected keeper function, in accordance with one embodiment. As previously discussed, the decoder selected keeper function provides intelligent decoupling of keeper signal from voltage source. The transistor level circuit of FIG. 5 implements the function, F 310, of FIG. 3. Thus, if any local bit line evaluates 530 and a corresponding select signal 540 is asserted, the pull down network 520 is shut off. Under these conditions, a corresponding stage 550 of the pull up network 510 will be enabled, bringing output F 560 to a logic "1".

In this embodiment, a transistor level implementation may be utilized to reduce the area overhead of the keeper turn-off circuit in comparison to a gate level implementation. In addition, in such an embodiment, the design may utilize minimum sized transistors to further reduce the area of the keeper decoupling circuit and to reduce switching energy overhead associated with the keeper decoupling circuit.

Figure 6:
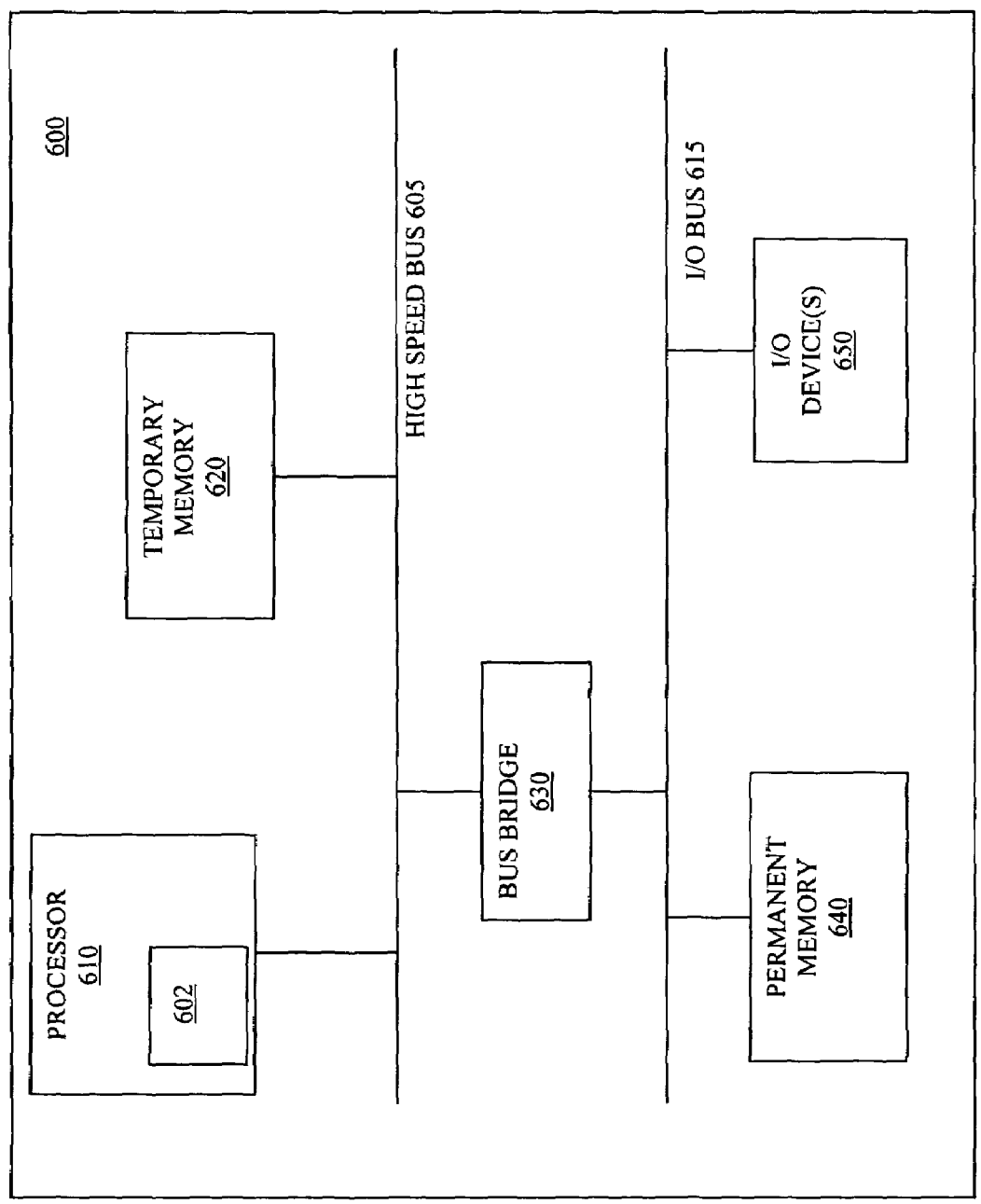
FIG. 6 illustrates a block diagram of a computer system including a register file with selectable keeper.

FIG. 6 illustrates a block diagram of a computer system 600 including a register file with selectable keeper 602. As shown, the computer system 600 includes a processor 610 and temporary memory 620, such as SDRAM and DRAM, on high-speed bus 605. Register file 602, incorporated with the earlier described selectable keeper teachings, advantageously provides high speed, yet robust, access to memory for processor 610. High-speed bus is connected through bus bridge 630 to input/output (I/O) bus 615. I/O bus 615 connects permanent memory 640, such as flash devices and fixed disk device, and I/O devices 650 to each other and bus bridge 630.

Thus, a more robust design of the dynamic bit lines of high performance register file is disclosed. While the invention has been described in accordance with a number of embodiments, the invention should not be considered so limited. One skilled in the art will recognize that various other embodiments can be utilized to provide the advantages described herein.

What is claimed is:

1. A register file, comprising;
   a multi-level multiplexer output circuit coupled to a global bit trace, said multi-level multiplexer output circuit comprises a plurality of local bit traces;
   keeper circuitry coupled to said global bit trace and a driving signal; and
   decoder circuitry coupled to said keeper circuitry to selectively decouple the driving signal trace from said global bit trace;
   a plurality of select signal traces corresponding to said plurality of local bit traces; and
   wherein said decoder circuitry is designed to:
   determine whether one of said plurality of select signal traces, corresponding to the evaluated bit trace, is asserted; and
   conditionally decouple said driving signal trace from said global bit trace, based at least in part on the results of said determines.

2. The register file of claim 1 wherein said conditionally decoupling occurs upon determining one of said plurality of local bit traces evaluates and determining one of said plurality of select signal traces, corresponding to said evaluated bit trace, is asserted.

3. The register file of claim 1 wherein said decoder is designed to perform said determining if one of said plurality of local bit traces evaluates by determining whether one of a plurality of row select signals and one of a plurality of data output signals couples one of said plurality of local bit traces to a first supply node.

4. The register file of claim 1 wherein said keeper circuitry comprises a P-type MOS transistor with a source coupled to said driving signal trace and a drain coupled to said global bit trace, and said selective decoupling of said driving signal trace from said global bit trace comprises turning off said P-type MOS transistor.

5. The register file of claim 1 wherein said local bit traces are coupled to a supply node through corresponding local bit trace precharge circuitries.

6. The register file of claim 5 wherein said local bit trace precharge circuitries comprise a P-type MOS transistor and an N-type MOS transistor, wherein a drain of said P-type MOS transistor is coupled to a power supply trace and a source of said P-type MOS transistor is coupled to a drain of said N-type MOS transistor and wherein a drain of said N-type MOS transistor is coupled to a corresponding local bit trace.

7. The register file of claim 6 wherein a gate of said P-type MOS transistor is coupled to a clock line and a gate of said N-type MOS transistor is coupled to said power supply trace.

8. A register file, comprising:
   a multi-level multiplexer output circuit coupled to a global bit trace;
   keeper circuitry couple to said global bit trace and a driving signal trace;
   decoder circuitry couple to said keeper circuitry to selectively decouple the driving signal trace from global bit trace; and
   wherein said multi-level multiplexer output circuit comprises a 3-stack pulldown.

9. The register file of claim 8 wherein said keeper circuitry comprises a weak P-type MOS transistor.

10. The register file of claim 8 further comprising a precharge transistor to precharge said global bit trace.

11. The register file of claim 8 wherein said multi-level multiplexer output circuit comprises a plurality of low threshold voltage transistors.

12. A method comprising:
    determining if one of a plurality of local bit traces evaluates;
    determining if one of a plurality of select signals on select signal traces, corresponding to local bit traces, is asserted; and
    conditionally decoupling a driving signal trace from a global bit trace, based at least in part on the results of said determining operations.

13. The method of claim 12 wherein said conditionally decoupling occurs upon determining one of said plurality of local bit traces evaluates and determining one of said plurality of select signal traces, corresponding to said evaluated bit trace, is asserted.

14. The method of claim 12 wherein said determining if one of a plurality of local bit traces evaluates comprises determining whether one of a plurality of row select signals and one of a plurality of data output signals couples one of said plurality of local bit traces to a first supply node.

15. The method of claim 12 wherein said conditionally decoupling a driving signal trace from a global bit trace comprises turning off a switching element.

16. The method of claim 15 wherein said switching element is a weak P-type MOS device.

17. A system comprising:
    a processor having:
       a register file including:
       a register file output signal trace;
       a driving signal trace; and
          a global bit trace coupled to said register file output signal trace;
          a multi-level multiplexer output circuit coupled to said global bit trace, said multi-level multiplexer output circuit comprises a plurality of local bit traces;
          keeper circuitry coupled to said global bit trace and the driving signal trace; and
          decoder circuitry coupled to said keeper circuitry to selectively decouple the driving signal trace from said global bit trace;
    a memory configured to store data;
    a bus coupled to the processor and memory to facilitate data exchange between the processor and memory;
    wherein said register file further comprises a plurality of select signal traces corresponding to said plurality of local bit traces and wherein said decoder circuitry operates to:
    determine whether one of said plurality of local bit traces evaluates;
    determine whether one of said plurality of select signal traces, corresponding to said evaluated bit trace, is asserted; and
    conditionally decouple said driving signal trace from said global bit trace, based at least in part on the results of said determined operations.

18. The system of claim 17 wherein said conditionally decoupling occurs upon determining one of said plurality of local bit traces evaluates and determining one of said plurality of select signal traces, corresponding to said evaluated bit trace, is asserted.

19. The system of claim 17 wherein said determining if one of said plurality of local bit traces evaluates comprises determining whether one of a plurality of row select signals and data output signals couples said local bit trace to a first supply node.

20. The system of claim 17 wherein said keeper circuitry comprises a P-type MOS transistor with a source coupled to said driving signal trace and a drain coupled to said global bit trace and wherein said intelligent decoupling said driving signal trace from said global bit trace comprises turning off said P-type MOS transistor.

21. The system of claim 17 wherein said keeper circuitry comprises an upsized P-type MOS transistor.

22. The system of claim 17 wherein said multi-level multiplexer output circuit comprises a plurality of low threshold voltage transistors.

23. The system of claim 17 wherein the system further comprises a graphic controller coupled to the bus.

* * * * *

UNITED STATES PATENT AND TRADEMARK OFFICE
CERTIFICATE OF CORRECTION

| | | |
|---|---|---|
| PATENT NO. | : 7,362,621 B2 | |
| APPLICATION NO. | : 10/676276 | |
| DATED | : April 22, 2008 | |
| INVENTOR(S) | : Bhaskar P. Chatterjee et al. | |

It is certified that error appears in the above-identified patent and that said Letters Patent is hereby corrected as shown below:

Column 5
Line 9, [Claim 1.] "…, comprising; …" should read --…, comprising: …--.

Line 14, [Claim 1.] "… driving signal; and" should read --…driving signal trace; and--.

Lines 20-24, [Claim 1.] "... wherein ... is designed to:
    determine whether one of said plurality of select signal traces, corresponding to
      the evaluated bit trace, is asserted; and
    conditionally decouple ..."

should read --… wherein ... is designed to:
    determine whether one of said plurality of local bit traces evaluates;
    determine if one of said plurality of select signal traces, corresponding to the
      evaluated bit trace, is asserted; and
    conditionally decouple ...--.

Lines 63-65, [Claim 8.] "... couple to ..." should read --...coupled to...--.

Column 6
Lines 36-37, "17. A system comprising:
    a processor having:
        a register file including:
        a register file output signal trace;
        a driving signal trace; and
        a global bit trace ..."

UNITED STATES PATENT AND TRADEMARK OFFICE
CERTIFICATE OF CORRECTION

PATENT NO. : 7,362,621 B2
APPLICATION NO. : 10/676276
DATED : April 22, 2008
INVENTOR(S) : Bhaskar P. Chatterjee et al.

It is certified that error appears in the above-identified patent and that said Letters Patent is hereby corrected as shown below:

should read --17. A system comprising:
    a processor having:
        a register file output signal trace;
        a driving signal trace; and
        a register file including:
            a global bit trace ...--.

Signed and Sealed this

Twenty-fifth Day of August, 2009

David J. Kappos
*Director of the United States Patent and Trademark Office*